United States Patent [19]
Glaser et al.

[11] Patent Number: 5,325,582
[45] Date of Patent: Jul. 5, 1994

[54] MULTI-FUNCTION WORKSTATION FOR ASSEMBLY AND REPAIR OF PRINTED WIRING BOARD ASSEMBLIES

[75] Inventors: Peter S. Glaser, Del Mar, Calif.; Jeffery A. Calkins, Auburn, N.Y.; Jeffrey M. Riggs, Colorado Springs, Colo.

[73] Assignee: TRW Inc., Redondo Beach, Calif.

[21] Appl. No.: 963,887

[22] Filed: Oct. 19, 1992

[51] Int. Cl.[5] .................. H05K 3/34; B23Q 41/00
[52] U.S. Cl. .................. 29/840; 29/564.1; 209/573; 364/468
[58] Field of Search ............ 29/840, 564.1, 564; 209/573, 574; 414/736; 364/468

[56] References Cited

U.S. PATENT DOCUMENTS 4,667,403  5/1987  Edinger et al. .................. 29/840

FOREIGN PATENT DOCUMENTS 3406325  2/1984  Fed. Rep. of Germany .

OTHER PUBLICATIONS

Hewlett Packard Journal Sep. 1983 pp. 25-28 by M. R. Perkins et al.
Circuits Manufacturing Apr. 1988 pp. 23-26 by T. A. Winter et al.
Circuits Assembly Dec. 1990 pp. 45-48 by J. A. Calkins.

Primary Examiner—Carl J. Arbes
Attorney, Agent, or Firm—Ronald L. Taylor

[57] ABSTRACT

Apparatus, and a related method for its operation, for integrating selected multiple assembly and repair operations of electronic component packages, such as printed wiring board assemblies (PWBAs), at a single multi-function workstation. Each PWBA product is uniquely identified by a bar code or similar inscription, and the identification permits product data to be retrieved from a factory or depot database. The retrieved product data controls the various operations to be performed, such as positioning and soldering of surface-mounted components, inspection for defects, desoldering of defective components, and reinstallation of replacement components.

10 Claims, 2 Drawing Sheets

5,325,582

MULTI-FUNCTION WORKSTATION FOR ASSEMBLY AND REPAIR OF PRINTED WIRING BOARD ASSEMBLIES

BACKGROUND OF THE INVENTION

This invention relates generally to techniques for manufacturing electronic components and, more particularly, to techniques for assembling, testing and repairing printed wiring board assemblies (PWBAs) and modules using surface mount technology (SMT), and modules of multiple PWBAs. Packaging technologies for electronic components used in advanced avionics systems require the placement and installation of components such as surface-mounted chip resistors and capacitors, ceramic leadless chip carriers, and fine-pitch devices with more than 100 leads on 25-mil (0.025 inch or approximately 0.1 mm), on printed wiring boards. Anticipated developments include devices with hundreds of pins and even closer pin spacings. In this environment, manufacturing operations such as stencil printing solder paste, and placing the components, are very exacting. "Reworking," i e. removing and replacing components, is difficult and costly, and subjects the entire assembly to risk of damage.

Manufacturing tools have been developed to handle various aspects of the difficulties associated with this demanding environment. Among the available tools are microscope-aided visual inspection stations, solder reflow machines for installing and removing fine-pitch devices, and a material dot dispenser for accurately placing solder pastes, thermal adhesives and component stand-offs. Even with the availability of these tools, the assembly, rework and repair of printed wiring board assemblies require significant manual intervention and depend heavily on operator skill. In this manual manufacturing or reworking environment, it is not possible to obtain the degree of process control needed to ensure consistently high productivity quality. In addition, the absence of computer integration in this environment requires manual compilation of design data, work instructions, test results, and product configuration data. This adds significant time, cost, and error potential to the assembly and repair cycle. The present invention is directed to a solution to these problems.

SUMMARY OF THE INVENTION

The present invention resides in apparatus and a related method for assembling and repairing printed wiring board assemblies (PWBAs). The apparatus of the invention comprises means for unambiguously identifying a PWBA from product code markings on the PWBA; means for retrieving product data relating to an identified PWBA; means for inspecting the PWBA at the workstation, based in part on the retrieved product data, and identifying any defects in the PWBA; and means for removing and replacing a defective component in the PWBA with minimal operator intervention. An important aspect of the invention is that all of its component parts are integrated into a single workstation site and are controlled in large measure by the retrieved product data. Therefore, the assembly and repair operations performed at the workstation are not highly dependent on operator skill.

The means for removing and replacing a defective component includes means for removing a conformal coating from the PWBA, and means for desoldering the defective component. Further, the means for removing and replacing a defective component includes means for positioning a replacement component on the PWBA, and means for soldering the replacement component in position on the PWBA.

In terms of a novel method, the present invention includes the steps of unambiguously identifying a PWBA from product code markings on the PWBA; retrieving product data relating to an identified PWBA; inspecting the PWBA at the workstation, based in part on the retrieved product data, and identifying any defects in the PWBA; and removing and replacing a defective component in the PWBA with minimal operator intervention. All of these steps are performed at a single integrated multi-function workstation and are driven by the retrieved product data.

In the method of the invention, the step of removing and replacing a defective component includes removing a conformal coating from the PWBA, desoldering the defective component, positioning a replacement component on the PWBA, and soldering the replacement component to the PWBA.

It will be appreciated from the foregoing that the present invention represents a significant advance in the field of assembly, inspection and repair of electronic component packages, such as printed wiring board assemblies. In particular, the invention provides for a selection of operations to be performed automatically, based on product data obtained from a factory database after the product is identified at the workstation, such as by a unique bar code. Other aspects and advantages of the invention will become apparent from the following more detailed description, taken in conjunction with the accompanying drawings.

DESCRIPTION OF THE PREFERRED EMBODIMENT

Figure 1:
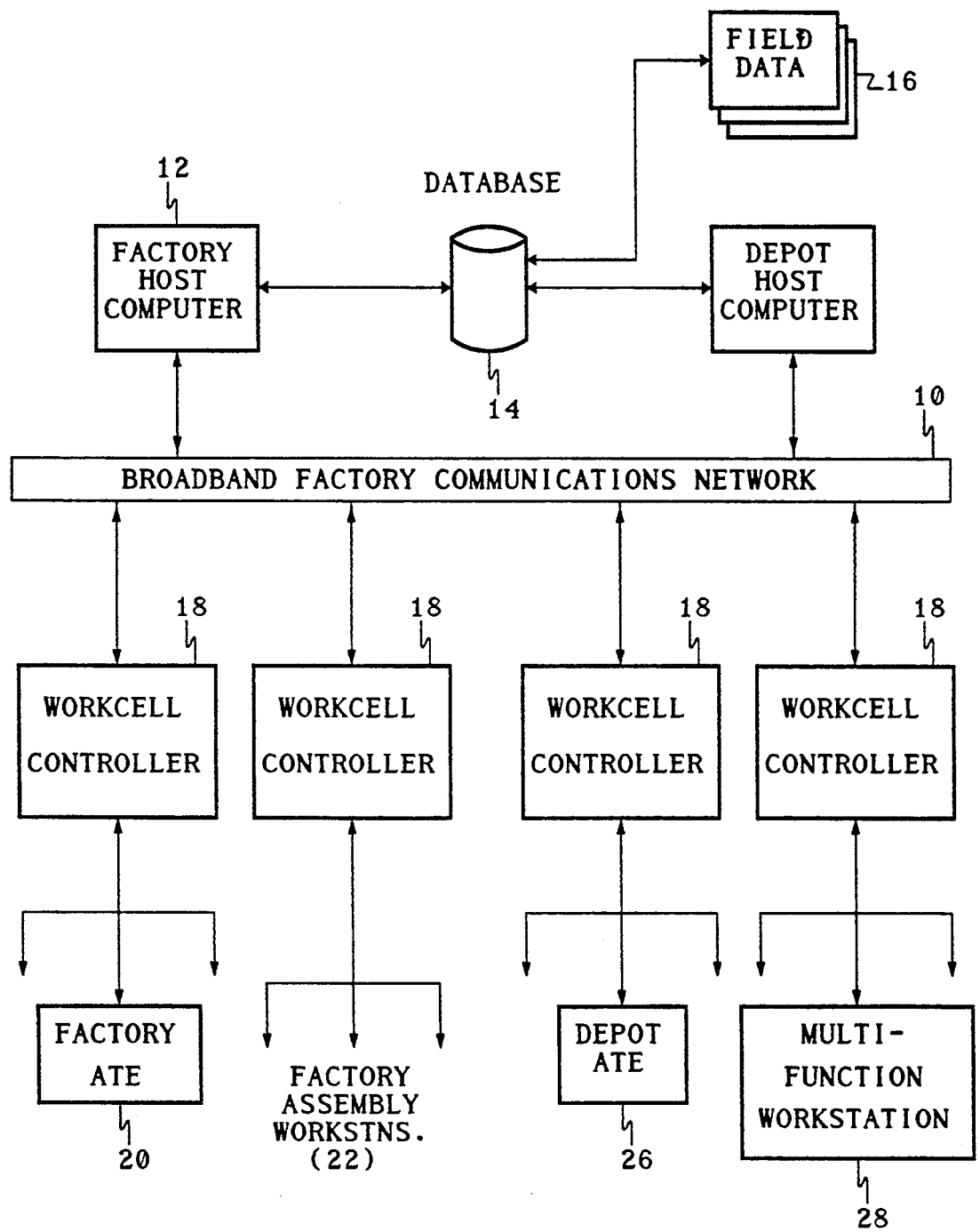
FIG. 1 is a block diagram showing how a multi-function workstation of the present invention fits into a factory manufacturing environment.

As shown in the drawings for purposes of illustration, the present invention is concerned with techniques for assembling, testing and repairing printed wiring board assemblies (PWBAs) using surface mount technology (SMT) to integrate devices with large numbers of closely spaced pins or leads into a single assembly. The difficulties inherent in handling devices and performing the necessary assembly and reworking operations are well known. Even when available precision techniques are used for placement of the devices and performing soldering or desoldering operations, the overall process is heavily dependent on operator skill. The present invention provides a multi-function workstation at which a number of operations related to assembly, testing and reworking can be performed in an automatic or semiautomatic manner, with less involvement by the operator.

FIG. 1 shows how the multi-function workstation of the invention is integrated into a complete manufacturing environment that makes use of a broadband factory communications network, indicated by reference numeral 10, which can take the form of a local area network using Ethernet or some other convenient communications protocol. Connected to the network 10 is a factory host computer 12, which has access to a database 14 containing, among other things, information concerning each of the products being manufactured. The database 14 may also be updated and accessed from field locations in the factory, as indicated at 16 in the figure.

Also connected to the network 10 are a number of workcell controllers 18 to direct operations at a local level at various sites in the factory. One workcell controller is shown as connected to factory automated test equipment (ATE) 20, and another is shown as connected to factory assembly workstations 22. At repair or rework depot level, but integrated into the factory environment, the system includes a depot host computer 24 connected to the network 10, and two of the workcell controllers 18. One of these is connected to depot automated test equipment (ATE) 26 and the other is connected to one or more multi-function workstations 28, which are the subject of the present invention.

The multi-function workstation of the invention combines selected functions at one workstation in a modular fashion and, because it is integrated with factory computing and database facilities, it can obtain processing and product data needed to perform its functions largely unaided by an operator. The key to replacing subjective operator judgment with repeatable process control is that each product being assembled or reworked is identified unambiguously, such as by barcode scanning, and control instructions for performing the required functions are obtained directly from the factory database, without the need for operator intervention.

Figure 2:
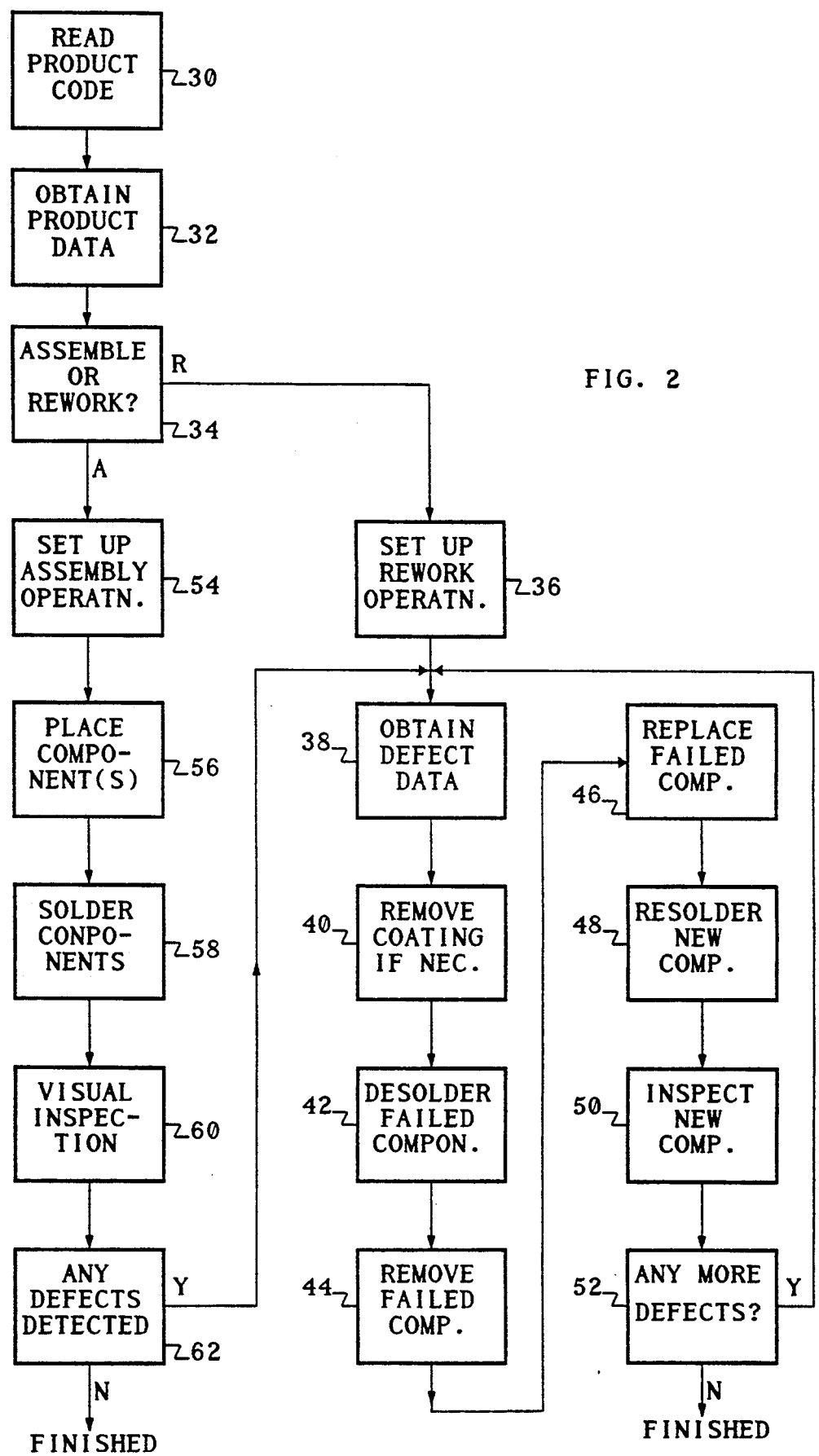
FIG. 2 is a flowchart of typical functions performed at a multi-function workstation in accordance with the invention.

As shown in FIG. 2, the functions performed by the workstation include reading a product code on a printed wiring board or module presented at the workstation, as indicated at 30; then obtaining the product data, as indicated at 32 from the factory database 14, through the factory network 10. The product data will be used by the workstation to formulate operational instructions for execution by a controller in the workstation. The data include design data, configuration management data, test results, and so forth.

Each workstation may be configured to meet application needs. For example, a workstation can be configured to perform reworking operations only, or to perform assembly and reworking. The question posed in block 34 is whether the workstation is to operate in assemble or reworking mode. If the workstation is operating purely in reworking mode, some initialization steps for this mode are performed (block 36), and then data relating a defect in the PWBA or module is obtained, as indicated in block 38. This may require activation of a visual inspection station, by means of which the operator will detect and record one or more defects, or it may involve simply obtaining data recorded in an inspection step performed earlier. Once a defect has been identified and its positional and other data obtained, the next step is to remove any conformal coating from the PWBA or module, as indicated at 40. This is done at a laser etching station. The next steps are to desolder a failed component identified as being defective, as indicated in block 42, and then to remove the failed component (block 44), and replace it with a new one (block 46). Then the replaced component is resoldered in place, as indicated in block 48, and an inspection step is performed (block 50) to determine whether the replacement component is all right. If there are any additional defects, as determined in block 52, whether in the replaced component or in another, the process continues with a return to block 38 to obtain the defect data. If there are no more defects, the process is terminated.

If the workstation is performing an assembly operation, as determined in block 34, after some initialization functions (block 54), the workstation picks up and places a component on the PWBA or module, based on assembly instructions obtained from the database, as indicated in block 56. Then the component is soldered in place (block 58). There may be successive passes through blocks 56 and 58, wherein a number of components are placed on the PWBA and soldered. Then the PWBA or module is visually inspected (block 60) for possible defects. If there are defects, as determined in block 62, processing continues in block 38, to remove and replace the defective component. If not defects are detected, the assembly operation is complete.

Each processing step requires its own specialized precision apparatus, but operation of the apparatus can be coordinated conveniently in the integrated workstation. For example, the inspection function requires a programmable X-Y-theta table for workpiece positioning and orientation, as well as a stereo dynascope and preferably a color closed-circuit television (CCTV) camera and monitor. Based on instructions retrieved from the database for the product being inspected, the operator is led through an orderly inspection sequence in which each critical structural feature of the assembly is examined microscopically. Interaction with the operator provides for approval of the product or the tagging of defects in such a way that the defect data can be retrieved for use in reworking the product.

In addition to the inspection station, other apparatus typically used at the workstation include a hotbar solder reflow machine, a laser engraver and a material dot dispenser.

The hotbar solder reflow machine has computer controlled time and temperature process parameter capabilities, and a precision X-Y table that allows fine-pitch devices to be accurately placed and soldered on PWBAs. The machine can also be used remove components as well as to place them.

The laser engraver also has an X-Y table, and computer controlled time, energy and table location parameters. The engraver can be used to remove conformal coatings from components prior to reworking operations.

The dot dispenser also has an X-Y table and is used to place, with high precision, small quantities of materials such as solder pastes, thermal adhesives and component standoffs, on a PWBA or module being processed.

The multi-function workstation of the invention has three principal benefits in the area of PWBA and module assembly and reworking. First, by lending itself to automation, the workstation permits repeatable, closed-loop control over critical assembly and reworking operations, which prior to this invention had depended on operator skill. Second, by integration with factory or depot information systems, the workstation makes possible automatic instruction generation base on design data, automated configuration management, and electronic communication of defect data to the database. Finally, use of the workstation reduces equipment development costs in the factory and depot environments.

It will be appreciated from the foregoing that the present invention represents a significant advance in the field of assembly and reworking of electronic components into printed wiring board assemblies and modules of multiple such assemblies. In particular, the invention makes possible automated assembly and repair processes at a single workstation, without relying as heavily on operator skill, and using product data stored in a factory or depot information system. It will also be appreciated that, although an embodiment of the invention has been described for purposes of illustration, various modifications may be made without departing from the spirit and scope of the invention. Accordingly, the invention is not to be limited except as by the appended claims.

We claim:

1. A method of operation of a multi-function workstation for assembling and repairing printed wiring board assemblies (PWBAs), comprising the steps of:
   unambiguously identifying a PWBA from product code markings on the PWBA;
   retrieving product data relating to an identified PWBA;
   inspecting the PWBA at the workstation, based in part on the retrieved product data, and identifying any defects in the PWBA; and
   removing and replacing a defective component in the PWBA with minimal operator intervention;
   wherein all of the foregoing steps are performed at a single integrated multi-function workstation and are driven by the retrieved product data.

2. A method as defined in claim 1, wherein the step of removing and replacing a defective component includes:
   removing a conformal coating from the PWBA; and
   desoldering the defective component.

3. A method as defined in claim 2, wherein the step of removing and replacing a defective component further includes:
   positioning a replacement component on the PWBA; and
   soldering the replacement component to the PWBA.

4. A multi-function workstation for assembling and repairing printed wiring board assemblies (PWBAs), comprising:
   a single workstation site and a plurality of component means situated about said single workstation site in a manner permitting each of said component means to operate at said single workstation site;
   said component means including means for unambiguously identifying a PWBA from product code markings on the PWBA;
   said component means also including means for retrieving product data relating to an identified PWBA;
   said component means also including means for inspecting the PWBA at the workstation, based in part on the retrieved product data, and identifying any defects in the PWBA; and
   said component means also including means for removing and replacing a defective component in the PWBA with minimal operator intervention;
   wherein all of the component means are driven by the retrieved product data.

5. A multi-function workstation as defined in claim 4, wherein the means for removing and replacing a defective component is provided with a plurality of sub-systems, including:
   sub-system means for removing a conformal coating from the PWBA; and
   sub-system means for desoldering the defective component.

6. A multi-function workstation as defined in claim 5, wherein the means for removing and replacing a defective component further includes:
   sub-system means for positioning a replacement component on the PWBA; and
   sub-system means for soldering the replacement component.

7. An apparatus for assembling and repairing printed wiring board assemblies (PWBAs), comprising:
   a single workstation site and a plurality of processing systems situated about said single workstation site in a manner permitting each one of said plurality of processing systems to operate at said single workstation site;
   said plurality of processing systems including a PWBA identification system, a PWBA assembly system, and a PWBA inspection system.

8. The apparatus of claim 7 wherein said plurality of processing systems further includes a PWBA reworking system.

9. The apparatus of claim 8 further including an automation control system communicating with said plurality of processing systems; said automation control system being operable to control, at least in part, various operations of said plurality of processing systems.

10. The apparatus of claim 9 wherein said automation control system includes a workcell controller in communication with said workstation; and wherein said automation control system further includes a factory computing and database system, said factory computing and database system communicating with said workcell controller via a factory communications network; wherein said factory computing and database system is operable to provide operational instructions to said workcell controller.

* * * * *